(12) United States Patent
Freeman et al.

(10) Patent No.: US 10,997,339 B2
(45) Date of Patent: May 4, 2021

(54) METHOD AND APPARATUS FOR SUPPORTING AUTOMATIC TESTBENCH PARALLELISM AND SERIAL EQUIVALENCE CHECKING DURING VERIFICATION

(71) Applicant: Intel Corporation, Santa Clara, CA (US)

(72) Inventors: John Stuart Freeman, Toronto (CA); Byron Sinclair, Toronto (CA); Dirk Seynhaeve, Soquel, CA (US)

(73) Assignee: Intel Corporation, Santa Clara, CA (US)

( * ) Notice: Subject to any disclaimer, the term of this patent is extended or adjusted under 35 U.S.C. 154(b) by 813 days.

(21) Appl. No.: 15/622,248

(22) Filed: Jun. 14, 2017

(65) Prior Publication Data

US 2018/0365346 A1 Dec. 20, 2018

(51) Int. Cl.
*G06F 30/3323* (2020.01)
*G06F 30/33* (2020.01)

(52) U.S. Cl.
CPC .......... *G06F 30/3323* (2020.01); *G06F 30/33* (2020.01)

(58) Field of Classification Search
CPC ............................ G06F 30/3323; G06F 30/33
See application file for complete search history.

(56) References Cited

U.S. PATENT DOCUMENTS

| | | | | |
|---|---|---|---|---|
| 5,920,830 A | * | 7/1999 | Hatfield | G01R 31/318307 702/119 |
| 10,558,437 B1 | * | 2/2020 | Denisenko | G06F 30/30 |
| 2002/0128812 A1 | * | 9/2002 | Gooding | G06F 30/33 703/23 |
| 2004/0015798 A1 | * | 1/2004 | Davidson | G01R 31/318558 716/106 |

* cited by examiner

*Primary Examiner* — Vuthe Siek

(57) ABSTRACT

A method for designing a system on a target device includes performing high-level compilation on a high-level language source file to generate a hardware description language (HDL) of the system and a serial testbench for the system. Verification is performed on the system that examines a parallel nature of the system by using the serial testbench.

25 Claims, 11 Drawing Sheets

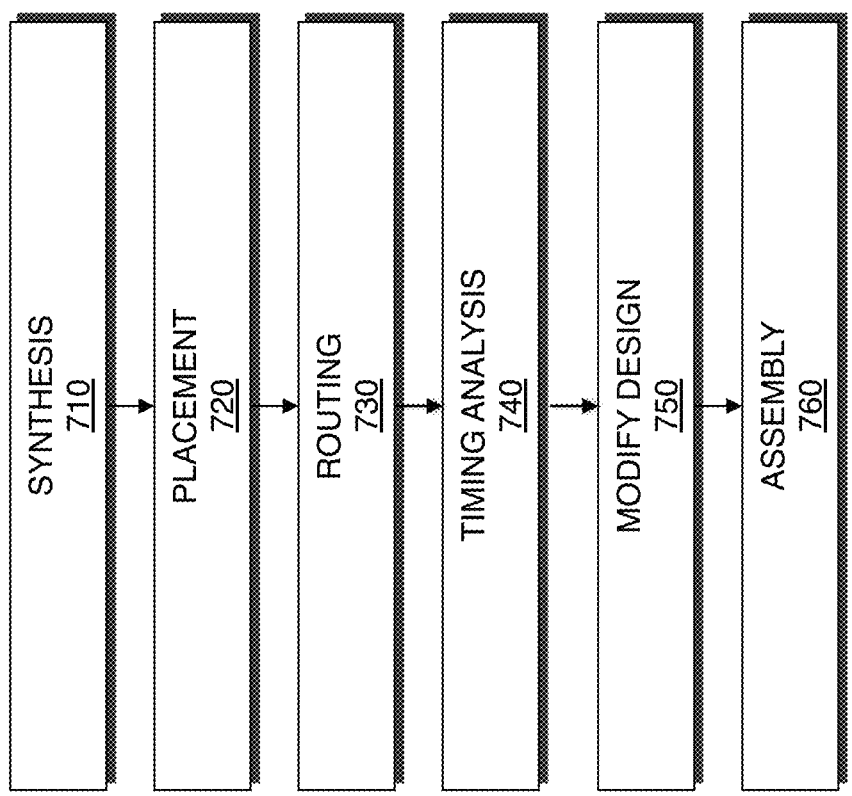

METHOD AND APPARATUS FOR SUPPORTING AUTOMATIC TESTBENCH PARALLELISM AND SERIAL EQUIVALENCE CHECKING DURING VERIFICATION

FIELD

Embodiments of the present disclosure relate to tools for designing systems on target devices. More specifically, embodiments of the present disclosure relate to a method and apparatus for supporting automatic testbench parallelism and serial equivalence checking during verification.

BACKGROUND

Target devices such as field programmable gate arrays (FPGAs), application specific integrated circuits (ASICs), and structured ASICs are used to implement large systems that may include million of gates and megabits of embedded memory. The complexity of a large system often requires the use of electronic design automation (EDA) tools to create and optimize a design for the system onto physical target devices.

Among the procedures performed by EDA tools in a computer aided design (CAD) compilation flow are high-level compilation and hardware description language (HDL) compilation. EDA tools that perform high-level compilation allow designers to more quickly realize designs for systems by raising the abstraction level from traditional register transfer level (RTL) based design. High-level compilation may take an algorithmic description of a system provided by a user that is in a high-level language format and analyze, constrain, and schedule the description to create an RTL HDL.

In addition to generating RTL HDL, high-level compilation may also create a testbench executable from a description provided by the user in high-level language format. A testbench may be used to debug and test the system. Typically, a simulation steps through the operation of a testbench, which stimulates the system. The simulation observes the transformations and translation of signals as they propagate through the system. The operation of a testbench, however, may be limited by the properties of the high-level language which it was originally created in.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

FIG. 7 is a flow chart illustrating a method for performing hardware description language compilation according to an exemplary embodiment of the present disclosure.

DETAILED DESCRIPTION

In the following description, for purposes of explanation, specific nomenclature is set forth to provide a thorough understanding of embodiments of the present disclosure. It will be apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

During high-level synthesis, a high-level design compiler may extract parallelism from sequential high-level code and generate a highly parallel datapath for a system. However, when a testbench is written in serial, high-level code, the high-level design compiler generates a serial testbench that exercises the system serially during simulation. Consequently, the highly parallel nature of the system compiled by the high-level compiler is not adequately tested during simulation because the hardware that manages parallelism is not exercised. Furthermore, any performance metrics generated by the serial testbench may not be accurate, as the simulation does not account for improved performance that is achieved through parallelism.

According to an embodiment of the present disclosure, a procedure is performed during verification to test the parallel nature of the system (device under test) using a serial testbench. The procedure creates two instances of the system. The first instance of the system is run serially to progress the test bench. The second instance of the system simulates the parallel nature of the system. Results from running the first instance of the system may be used to resolve data dependencies when running the second instance of the system. In an embodiment of the present disclosure where the first and second instances of the system are implemented by different components and the first and second instances are run concurrently, the first instance of the system is run at a faster rate than the second instance of the system. Results from running the second instance of the system may be used to evaluate performance, and results from running the second instance of the system may be compared with running the first instance of the system to evaluate for serial consistency.

A potential advantage of the verification procedure of the present disclosure is that it allows for a serial testbench to examine the parallel nature of a system. This allows designers (users) to create testbenches using a serial, high-level language without requiring the designer to create a parallel application to achieve full functional coverage and to extract useful performance data from the system during verification.

Figure 1:
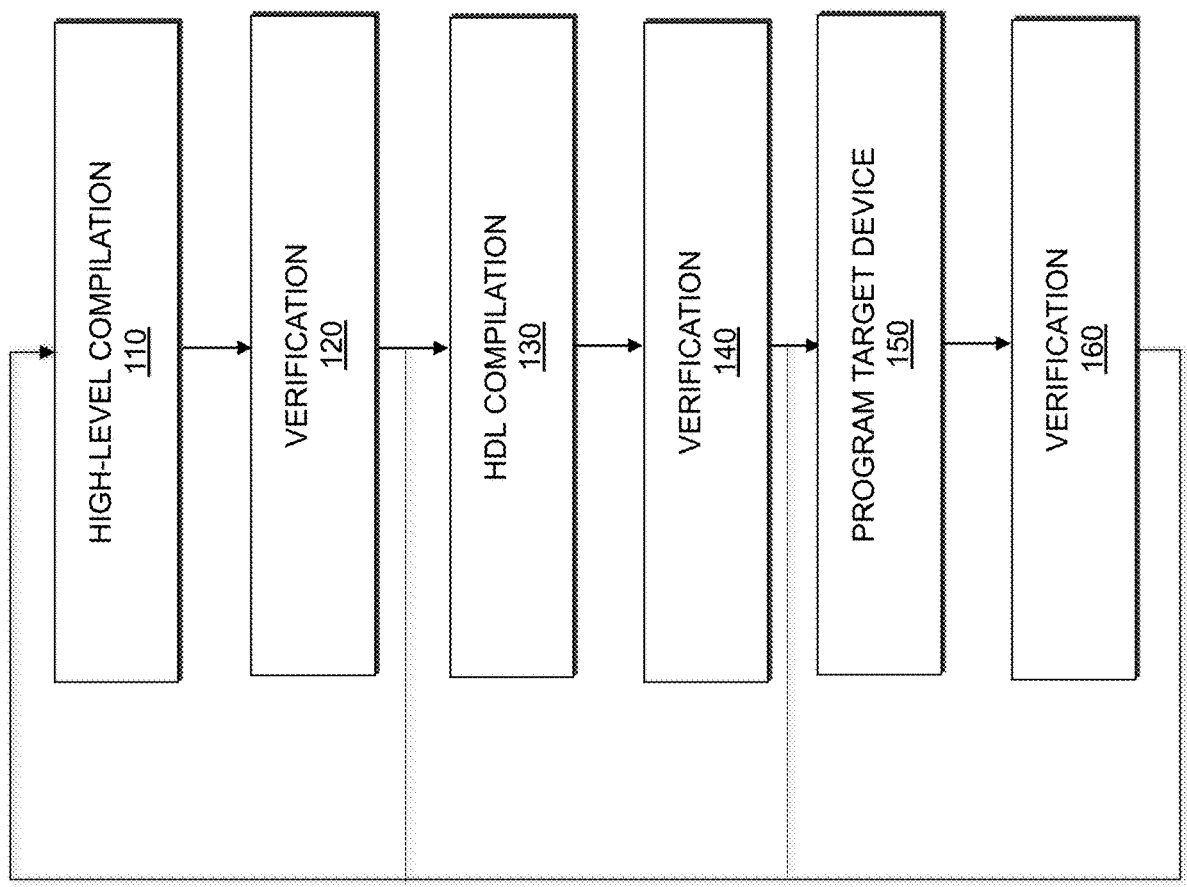
FIG. 1 is a flow chart illustrating a method for designing a system on a target device according to an exemplary embodiment of the present disclosure.

FIG. 1 is a flow chart illustrating a method for designing a system on a target device according to an exemplary embodiment of the present disclosure. The target device may be a field programmable gate array (FPGA), application specific integrated circuit (ASIC), a structured ASIC, or other device whose functionality is described by a hardware description language (HDL). According to one embodiment, the procedure illustrated in FIG. 1 may be performed by one or more computer aided design (CAD)/electronic design automation (EDA) tools, simulators, and testers implemented on one or more computer system, and/or target devices.

At 110, high-level compilation (or "high-level design compilation"/"high-level synthesis") of a design for a system is performed. According to an embodiment of the present disclosure, high-level compilation interprets a description of the system, which may be an algorithmic description of a desired behavior written in a computer language description, and generates a digital hardware description that implements the behavior. The computer language description may be a high-level description written in a serial computer language such as C, C++, or other serial computer language. The computer language description may be analyzed, architecturally constrained, and scheduled to create a register transfer level (RTL) HDL of the system. The HDL of the system may integrate information regarding other components or hosts that may be pre-designed. The HDL of the system may be referred to as a hardware version of the system. According to an embodiment of the present disclosure, in addition to creating a hardware version of the system, the high-level compilation may create a software version of the system that is executable on a processor and may be used for the purpose of performing simulation. The software version may be independent of any specific resources of a target device and may be independent of the HDL of the system. According to an embodiment of the present disclosure, high-level compilation also creates a serial testbench executable from a description of the testbench provided by the user in the computer language description. The serial testbench may be used to debug and test the system during verification.

At 120, verification is performed on the system. According to an embodiment of the present disclosure, the serial testbench generated at high-level compilation is used to execute calls to the system in parallel. To address component call data dependencies, two instances of the system is generated during verification. The first instance is executed serially and the results generated are used to provide data for the serial testbench. The second instance runs in a separate thread and is invoked with parallelism. Data dependencies associated with the second instance may be resolved by using results generated by the first instance. This allows for the simulation of the fully parallel nature of the system and provides for the adequate testing of the system and for accurate performance metrics to be obtained.

According to an embodiment of the present disclosure, when verification is performed after high-level compilation 110 and before HDL compilation, the first instance of the system may be implemented by a software version of the system that may be run on a processor running the serial testbench. Alternatively, the first instance of the system may be implemented by a hardware version of the system based on HDL run on a simulator. The second instance of the system may be implemented by a hardware version of the system based on the HDL run on the simulator.

It should be appreciated that the input vectors generated by the serial testbench may be transmitted to the first instance of the system and the second instance of the system concurrently. In this embodiment, the first instance of the system processes the input vectors at a rate faster than the second instance of the system processes the input vectors. According to an alternative embodiment of the present disclosure, both the first instance of the system and the second instance of the system may be the same, single instance, but executed at different times. In this embodiment, the input vectors generated by the serial testbench are transmitted and completely processed by the first instance of the system before subsequently being transmitted and processed by the second instance of the system.

During verification 120, the serial testbench is used to debug and test the system. A simulation steps through the operation of the serial testbench, which stimulates the system. The simulation observes the transformations and translation of signals as they propagate through the system. In response to the results of verification, a designer may modify the description in response to the results of the verification and control may return the modified description to high-level compilation 110.

At 130, HDL compilation is performed. HDL compilation involves performing synthesis, placement, routing, and timing analysis on the HDL of the system onto a designated target device and generating a program ("configuration") file for the target device.

At 140, verification is performed on the system. The verification performed at 140 may be similar to the verification performed at 120 and may be performed in addition to or in place of the verification performed at 120. According to an embodiment of the present disclosure, when verification is performed after HDL compilation 130 and before programming the target device, the first instance of the system may be implemented by a software version of the system that may be run on a processor running the serial testbench. Alternatively, the first instance of the system may be implemented by a hardware version of the system based on compiled HDL run on a simulator. The second instance of the system may be implemented by a hardware version of the system based on the compiled HDL running on the simulator. Performing verification after HDL compilation 130 provides the added benefit of performing simulation later in the design flow where additional information obtained from synthesis, placement, and routing of the system is available.

As with verification performed at 120, it should be appreciated that the input vectors generated by the serial testbench may be transmitted to the first instance of the system and the second instance of the system concurrently. In this embodiment, the first instance of the system processes the input vectors at a rate faster than the second instance of the system processes the input vectors. According to an alternative embodiment of the present disclosure, both the first instance of the system and the second instance of the system may be the same, single instance, but executed at different times. In this embodiment, the input vectors generated by the serial testbench are transmitted and completely processed by the first instance of the system before subsequently being transmitted and processed by the second instance of the system.

During verification 140, the serial testbench is used to debug and test the system. A simulation steps through the operation of the serial testbench, which stimulates the system. The simulation observes the transformations and translation of signals as they propagate through the system. In response to the results of verification, a designer may modify the description in response to the results of the verification and control may return the modified description to high-level compilation 110.

At 150, the target device is programmed using the program file to implement the system. According to an embodiment of the present disclosure, the program file may be generated and transmitted to another computer system that may be used to program the target device according to the system design. By programming the target with the program file, components on the target device are physically transformed to implement the system.

At 160, verification is performed on the system. The verification performed at 160 may be similar to the verification performed at 120 and 140 and may be performed in addition to or in place of verification performed at 120 and 140. According to an embodiment of the present disclosure, when verification is performed after programming the target device 150, the first instance of the system may be implemented by a software version of the system that may be run on a processor running the serial testbench. Alternatively, the first instance of the system may be implemented by a hardware version of the system based on the compiled HDL programmed on the target device. The second instance of the system may be implemented by a hardware version of the system based on the compiled HDL programmed on the target device. Performing verification after programming the target device 150 provides the added benefit of performing simulation at the last procedure of the design flow where actual performance data from the actual programmed target device is available.

As with verification performed at 120 and 140, it should be appreciated that the input vectors generated by the serial testbench may be transmitted to the first instance of the system and the second instance of the system concurrently. In this embodiment, the first instance of the system processes the input vectors at a rate faster than the second instance of the system processes the input vectors. According to an alternative embodiment of the present disclosure, both the first instance of the system and the second instance of the system may be the same, single instance, but executed at different times. In this embodiment, the input vectors generated by the serial testbench are transmitted and completely processed by the first instance of the system before subsequently being transmitted and processed by the second instance of the system.

It should be appreciated that the serial testbench may be executed for the first instance of the system during a first verification procedure while the serial testbench may be executed for the second instance of the system during a second verification procedure. For example, the serial testbench may be executed for a first instance of the system implemented by a software version of the system that may be run on a processor running the serial testbench at verification 120. The serial testbench may be executed for the second instance of the system implemented by a hardware version of the system based on the compiled HDL run on a simulator at 140 or programmed on the target device at verification 160.

Figure 2:
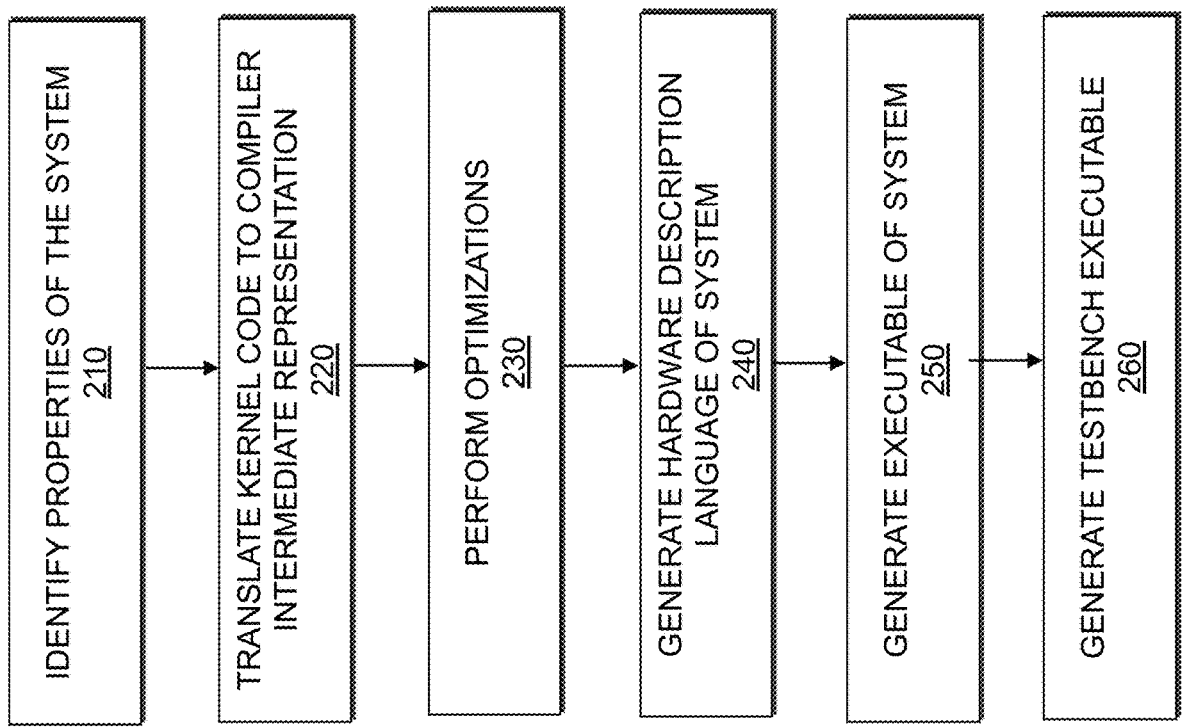
FIG. 2 is a flow chart illustrating a method for performing high-level compilation according to an exemplary embodiment of the present disclosure.

FIG. 2 is a flow chart illustrating a method for performing high-level compilation of a system according to an embodiment of the present disclosure. According to an embodiment of the present disclosure, the procedures shown in FIG. 2 may be used to implement procedure 110 in part (shown in FIG. 1). At 210, properties of the system are identified. According to an embodiment of the present disclosure, the properties of the system may include functions and algorithms performed by the system by one or more compute devices, and may be identified from a computer language description of the system provided by a designer. The computer language description of the system may be, for example, a high-level language such as C, C++ or another computer language description format that provides a framework for writing programs that execute across heterogeneous platforms. The computer language description format may be used for writing kernels and application programming interfaces (APIs) that are used to define and control platforms. According to an embodiment of the present disclosure, the properties of the system may be referred to as kernel code.

At 220, the kernel code is translated to compiler intermediate representation. According to an embodiment of the present disclosure, the compiler intermediate representation of the kernel code includes a sequence of functions. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. The kernel code may also include a system description of the hardware target system which it is to be implemented on.

At 230, the compiler intermediate representation is optimized according to properties of the platform for the system. The platform for the system may include components and hosts that interface with the system.

At 240, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals. The HDL of the design of the system may be run on a simulator and may be referred to as a hardware version of the system.

At 250, an executable of the system is generated. The executable is different from the HDL generated at 240 in that the executable of the system does not tie the system to any specific hardware for implementation and does not originate from the HDL. The executable of the system may be run on a simulator and be referred to as a software version of the system. According to an embodiment of the present disclosure, the executable of the system is implemented as computer instructions by compiling a computer language description of the system written in a serial computer language.

At 260, a serial testbench executable is generated from a testbench in high-level language format. The testbench is an application written for providing input and verifying output of a HLS component. According to an embodiment of the present disclosure, aspects of the computer language description of the system that are not identified as hardware implementable components of the system are used to derive the serial testbench. For example input source code that includes a main ( ) function and its function calls may be used to generate the testbench executable.

Figure 3:
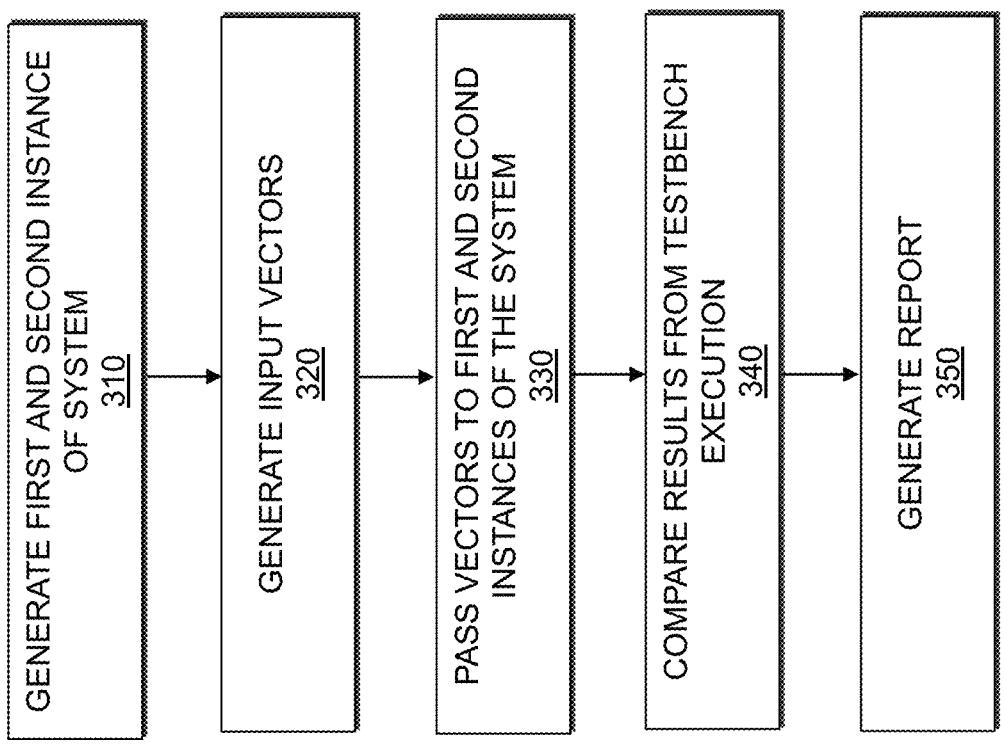
FIG. 3 is a flow chart illustrating a method for performing verification according to an exemplary embodiment of the present disclosure.

FIG. 3 is a flow chart illustrating a method for performing verification of a system according to an exemplary embodiment of the present disclosure. According to an embodiment of the present disclosure, the procedures shown in FIG. 3 may be used to implement procedures 120, 140, and/or 160 in part (shown in FIG. 1). At 310, a first instance of a system and second instance of a system are generated. The first instance of the system may be implemented by a software version of the system executing on a simulator. The software version may simulate the system in a manner that is independent of any specific hardware from a target device and independent of a HDL description of the system. Alternatively, the first instance of the system may be implemented by a hardware version of the system run on a simulator using a compiled or uncompiled HDL description of the system. The first instance of the system may also be implemented by a hardware version of the system that is an actual target device programmed with the compiled HDL description of the system. The second instance of the system may also be implemented by one of the hardware versions of the system described.

At 320, input vectors are generated for testing the system. According to an embodiment of the present disclosure, the serial testbench is executed which generates input vectors that may be used for testing the system.

At 330, the input vectors are passed to the first and second instances of the system. The same input vectors generated from the serial testbench are passed to both the first and second instances of the system. The first instance of the system processes the input vectors in a serial manner. For example, a subsequent call to a function is made only after results from a previous call to the function is returned. The results generated by the first instance of the system are stored and are returned to process subsequent input vectors from the serial testbench. The second instance of the system processes the input vectors in a parallel manner. According to an embodiment of the present disclosure, the second instance runs in a separate thread and is invoked with maximum parallelism. For example, a subsequent call to a function may be made before results from a previous call to the function is returned.

According to an embodiment of the present disclosure, the first instance of the system processes the input vectors at a faster rate than the second instance of the system processes the input vectors. This allows the first instance of the system to generate results from processing the input vectors in time if the second instance requires the results. As such, data dependency issues resulting by having the second instance issue a plurality of calls to a function to be made in parallel may be resolved by using results generated ahead of time by the first instance of the system.

At 340, results from the serial testbench execution are compared. According to an embodiment of the present disclosure, results generated by the first instance of the system that executes the serial testbench in a serial manner are compared with results generated by the second instance of the system that executes the serial testbench in a parallel manner. If the results generated from the first instance of the system and the results generated from the second instance of the system are equivalent, there is confirmation that there is serially equivalence for a fully parallel execution of the system. According to an embodiment of the present disclosure, serial equivalency provides assurance that a hardware implementation will work correctly when an accelerated function's output is equivalent to an original serial description's output. It should be appreciated that the definition of equivalency may be defined by a user. For example, the user may require each result generated by the first instance of the system to be equal to each result generated by the second instance of the system in order for their to be serial equivalency. Alternatively, the user may provide a range in which results are not equal, but where there is still serial equivalency.

At 350, a report is generated. According to an embodiment of the present disclosure, the report may provide performance data from execution of the serial testbench as well as an as to indication whether there is serial equivalency. The user may use the report to modify a description of the system for re-compilation.

Figure 4:
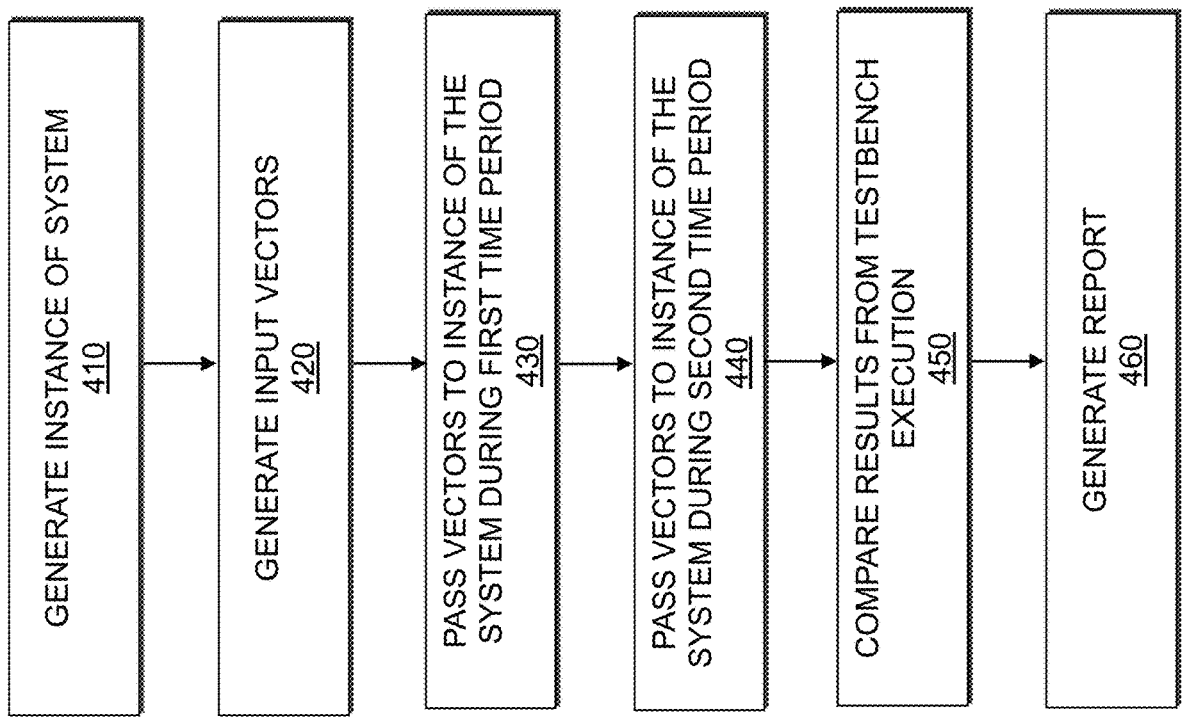
FIG. 4 is a flow chart illustrating a method for performing verification according to an alternative exemplary embodiment of the present disclosure.

FIG. 4 is a flow chart illustrating a method for performing verification according to an alternative exemplary embodiment of the present disclosure. According to an embodiment of the present disclosure, the procedures shown in FIG. 4 may be used to implement procedures 120, 140, and/or 160 in part (shown in FIG. 1). At 410, an instance of a system is generated. The instance of the system may be implemented by a hardware version of the system run on a simulator using a compiled or uncompiled HDL description of the system. The instance of the system may also be implemented by a hardware version of the system that is an actual target device programmed with the compiled HDL description of the system.

At 420, input vectors are generated for testing the system. According to an embodiment of the present disclosure, the serial testbench is executed which generates input vectors that may be used for testing the system.

At 430, the input vectors are passed to the instance of the system at a first time period. During the first time period, the instance of the system processes the input vectors in a serial manner. For example, a subsequent call to a function is made only after results from a previous call to the function is returned. The results generated by the first instance of the system are stored and are returned to process subsequent input vectors from the serial testbench.

At 440, the input vectors are passed to the instance of the system at a second time period after the instance of the system has completed processing the input vectors passed during the first time period. During the second time period, the instance of the system processes the input vectors in a parallel manner. According to an embodiment of the present disclosure, the instance is invoked with maximum parallelism. For example, a subsequent call to a function may be made before results from a previous call to the function is returned.

According to an embodiment of the present disclosure, passing the input vectors to the instance during the second time period after the instance has completed processing the same input vectors during the first time period allows the instance to have access to results from the first time period. As such, data dependency issues resulting from having the instance issue a plurality of calls to a function in parallel during the second period may be resolved by using results generated earlier by the instance of the system during the first time period.

At 450, results from the serial testbench execution are compared. According to an embodiment of the present disclosure, results generated by the instance of the system during the first time period that executes the serial testbench in a serial manner are compared with results generated by the instance of the system during the second time period that executes the serial testbench in a parallel manner. If the results generated from the instance of the system during the first time period and the results generated from the instance of the system during the second time period are equivalent, there is confirmation that there is serially equivalence for a fully parallel execution of the system. It should be appreciated that the definition of equivalency may be defined by a user. For example, the user may require each result generated by the instance of the system during the first time period to be equal to each result generated by the instance of the system in the second time period in order for their to be serial equivalency. Alternatively, the user may provide a range in which results are not equal, but where there is still serial equivalency.

At 460, a report is generated. According to an embodiment of the present disclosure, the report may provide performance data from execution of the serial testbench as well as an as to indication whether there is serial equivalency. The user may use the report to modify a description of the system for re-compilation.

Figure 5:
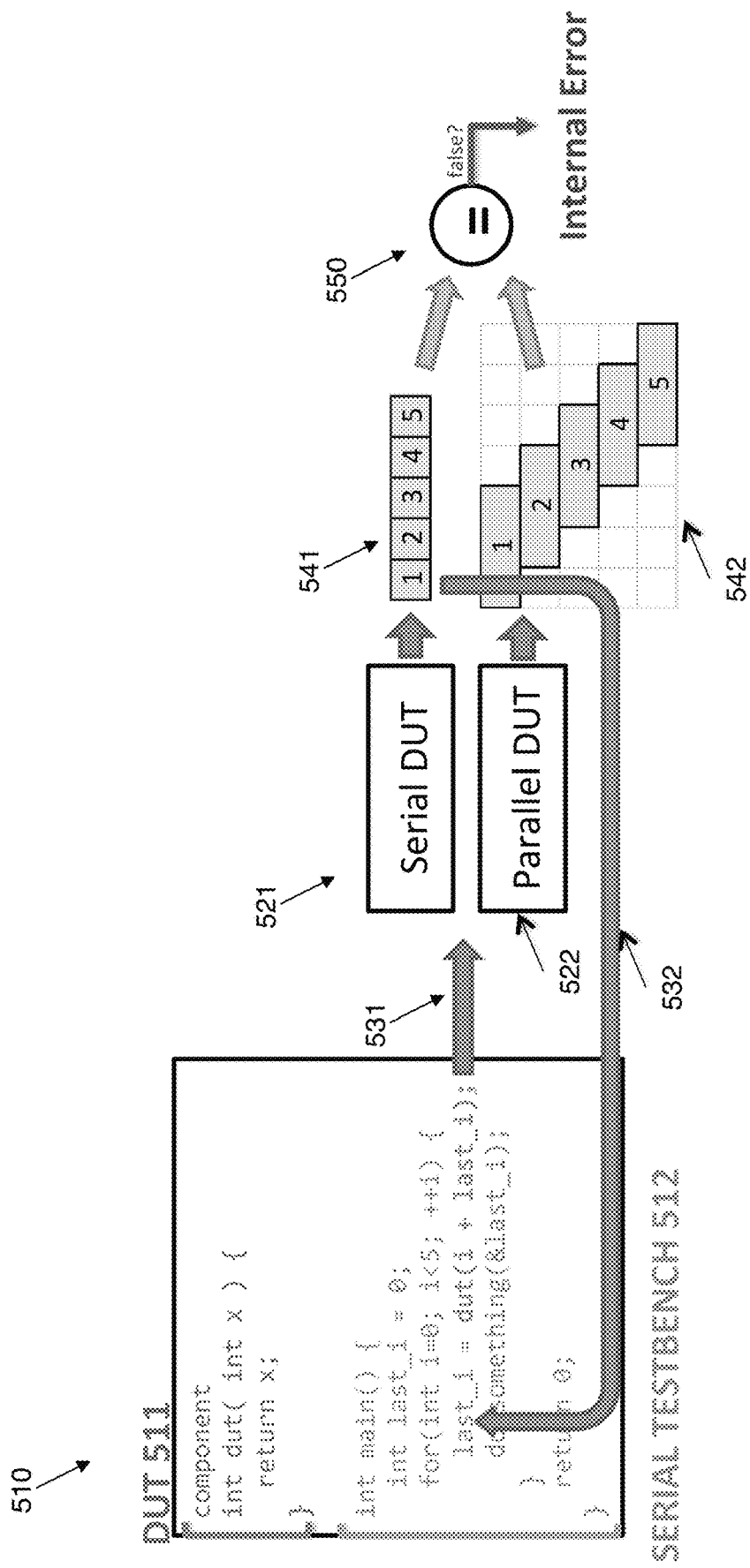
FIG. 5 is a conceptual illustration of data flow during verification according to an exemplary embodiment of the present disclosure.

FIG. 5 is a conceptual illustration of data flow during verification according to an exemplary embodiment of the present disclosure. A source file 510 is shown which includes a description of a system (device under test ("DUT")) 511, and a serial testbench 512. The description of the system 511 defines the device under test. The serial testbench 512 includes instructions for generating input vectors to the device under test that may be verified. According to an embodiment of the present disclosure, the serial testbench 512 is written in a serial, high-level code. In this example, the serial testbench 521 includes a function that requires two inputs variables, i and last_i. The output of the function is designated as last_i for the next call to the function. Since this function depends on the output of the previous call, there is data dependency.

Serial DUT 521 represents a first instance of the system that is generated during verification. Parallel DUT 522 represents a second instance of the system that is generated during verification. The serial DUT 521 and parallel DUT 522 may be implemented using any of the techniques described with reference to FIGS. 1-4. When the serial testbench 512 is executed, input vectors that may be used for testing the system are generated. The input vectors are passed to the serial DUT 521 and the parallel DUT 522 as shown by arrow 531. The serial DUT 521 processes the input vectors in a serial manner. For example, each subsequent call to the function "main" is made only after results from a previous call to the function is returned. Each result generated by the serial DUT 521 is stored in queue 541 and is returned to process subsequent input vectors from the serial testbench 512 as shown by arrow 532.

The parallel DUT 522 processes the input vectors in a parallel manner. According to an embodiment of the present disclosure, the parallel DUT 522 runs in a separate thread and is invoked with maximum parallelism. For example, each subsequent call to the function "main" may be made before results from a previous call to the function is returned. Instead of waiting for the results from the previous call, the parallel DUT 522 uses the result generated earlier from the serial DUT 521 that is stored in queue 541. This allows the results generated by the parallel DUT 522 to be generated in parallel as illustrated by 542. The results from the serial testbench execution by serial DUT 521 and parallel DUT 522 are compared as shown at 550 to determine whether there is serial equivalence between serial DUT 521 and parallel DUT 522.

According to an embodiment of the present disclosure, the serial DUT 521 and the parallel DUT 522 are two separate devices and may operate concurrently. In this embodiment, the serial DUT 521 processes the input vectors at a faster rate than the parallel DUT 522 processes the input vectors. This allows the serial DUT 521 to generate results from processing the input vectors in time for the parallel DUT 522 to use if there is data dependency. As such, data dependency issues resulting by having the second instance issuing a plurality of calls to a function to be made in parallel may be resolved by using results generated ahead of time by the first instance of the system.

According to an alternate embodiment of the present disclosure, the serial DUT 521 and the parallel DUT 522 are implemented by a same device or DUT. In this embodiment, input vectors are passed to the DUT a first time during a first time period to allow the DUT to process the input vectors serially and generate results. After the DUT has completed processing the input vectors, the same input vectors are passed to the DUT a second time during a second time period to allow the DUT to process the input vectors in a parallel manner. This allows the DUT to have access to results generated from processing the input vectors during the first time period. As such, data dependency issues resulting by having the DUT issue a plurality of calls to a function made in parallel during the second period may be resolved by using results generated earlier by the DUT during the first time period.

Figure 6A:
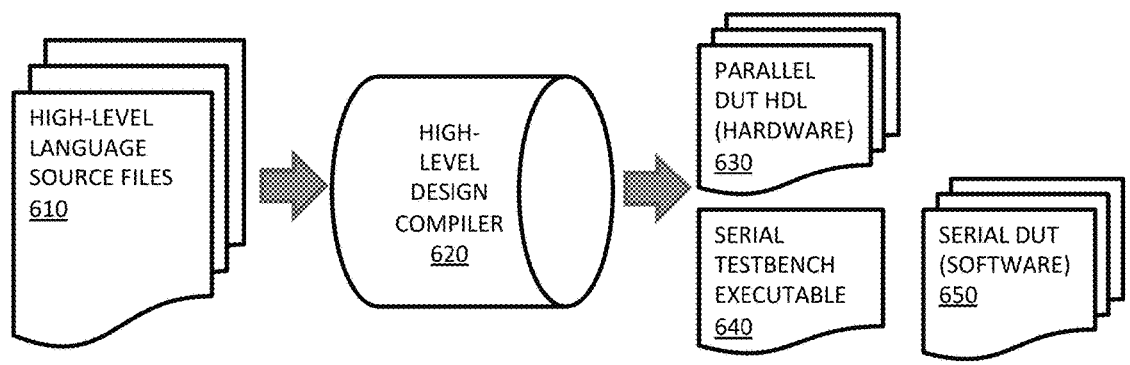
FIGS. 6A-C illustrate implementations of systems during verification according to an exemplary embodiment of the present disclosure.
Figure 6B:
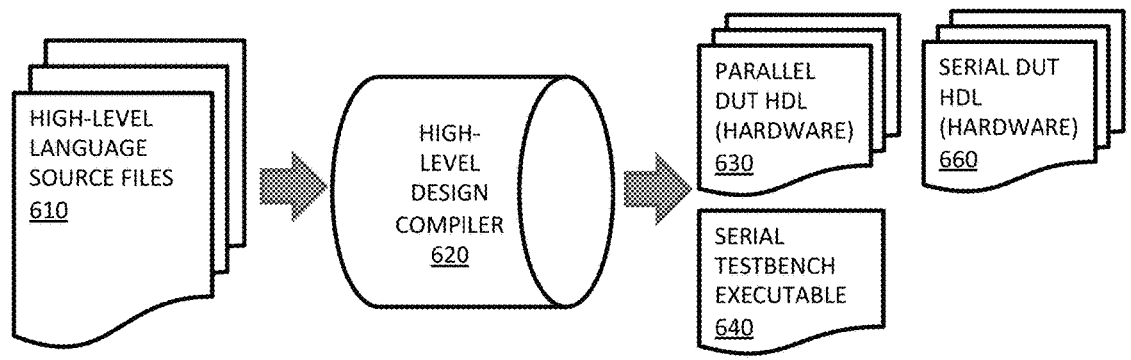
Figure 6C:
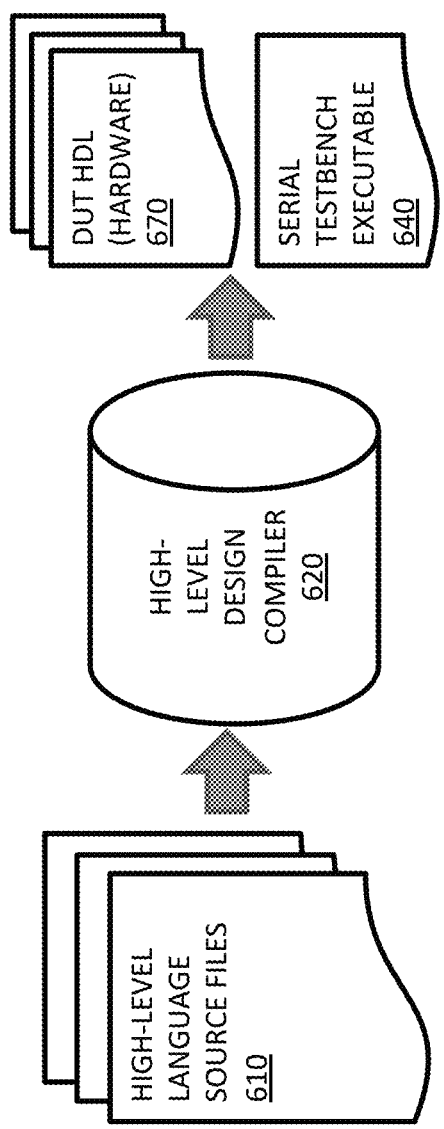

FIG. 6A-C illustrate implementations of systems during verification according to an exemplary embodiment of the present disclosure. FIG. 6A illustrates high-level language source files 610 transmitted to a high-level design compiler 620. The high-level language source files 610 may include a description of a system and a serial testbench written in a sequential, high-level computer language such as C, C++, or other high-level computer language that may be serial in nature.

From the high-level language source files 610, the high-level design compiler 620 may extract parallelism from the description of the system and generate a HDL of the system that has a highly parallel datapath, parallel DUT HDL 630. Parallel DUT HDL 630 may be used for a hardware implementation of the system. The high-level design compiler 620 also generates a serial testbench executable 640 that may be used to test the system. According to an embodiment of the present disclosure, the high-level design compiler 620 also generates a software version of the system, serial DUT 650. Serial DUT 640 is executable on a processor and may be used for the purpose of performing simulations. The parallel DUT HDL 630 and the serial DUT 650 represent a first instance and a second instance of the system that may be used during verification to examine a parallel nature of the system using the serial testbench executable.

FIG. 6B illustrates an alternative implementation of systems during verification according to an exemplary embodiment of the present disclosure. From the high-level language source files 610, the high-level design compiler 620 may extract parallelism from the description of the system and generate a HDL of the system that has a highly parallel datapath, parallel DUT HDL 630. The high-level design compiler 620 also generates a serial testbench executable 640 that may be used to test the system. According to an embodiment of the present disclosure, during verification, a serial DUT HDL 660 is generated. As with the parallel DUT HDL 630, the serial DUT HDL 660 may be used for a hardware implementation of the system. The parallel DUT HDL 630 and the serial DUT HDL 660 represent a first instance and a second instance of the system that may be used during verification to examine a parallel nature of the system using the serial testbench executable.

FIG. 6C illustrates an alternative implementation of systems during verification according to an exemplary embodiment of the present disclosure. From the high-level language source files 610, the high-level design compiler 620 may extract parallelism from the description of the system and generate a HDL of the system that has a highly parallel datapath, DUT HDL 670. DUT HDL 670 may be used for a hardware implementation of the system. The high-level design compiler 620 also generates a serial testbench executable 640 that may be used to test the system. According to an embodiment of the present disclosure, during verification, the DUT HDL 670 represent both a first instance and a second instance of the system that may used during verification to examine a parallel nature of the system using the serial testbench executable. During the first instance of the system, DUT HDL 670 may be used during a first period of time. During the second instance of the system, DUT HDL 670 may be used during a second period of time, after the first period of time.

FIG. 7 is a flow chart illustrating a method for performing hardware description language compilation according to an exemplary embodiment of the present disclosure. According to an embodiment of the present disclosure, the procedures illustrated in FIG. 7 may be used to implement procedure 130 (shown in FIG. 1). At 710, the system is synthesized. Synthesis includes generating a logic design of the system to be implemented by the target device. According to an embodiment of the present disclosure, synthesis generates an optimized logical representation of the system from an HDL design definition. Synthesis also includes mapping the optimized logic design. Mapping includes determining how to implement logic gates and logic elements in the optimized logic representation with specific resources on the target device such as logic elements and functional blocks. According to an embodiment of the present disclosure, a netlist is generated from mapping. This netlist may be an optimized technology-mapped netlist generated from the HDL.

At 720, the system is placed. According to an embodiment of the present disclosure, placement involves placing the mapped logical system design on the target device. Placement works on the technology-mapped netlist to produce a placement for each of the logic elements and functional blocks. According to an embodiment of the present disclosure, placement includes fitting the system on the target device by determining which resources on the target device are to be used to implement the logic elements and functional blocks identified during synthesis. Placement may include clustering which involves grouping logic elements together to form the logic clusters present on the target device. According to an embodiment of the present disclosure, clustering is performed at an early stage of placement and occurs directly after synthesis during the placement preparation stage.

At 730, the placed design is routed. During routing, routing resources on the target device are allocated to provide interconnections between logic gates, logic elements, and other components on the target device. Routability optimization may also be performed on the placed logic design. According to an embodiment of the present disclosure, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 740, timing analysis is performed on the system designed by procedures 710, 720, and 730. According to an embodiment of the present disclosure, the timing analysis determines whether timing constraints of the system are satisfied.

At 750, the system is modified. According to an embodiment of the present disclosure, the system may be optionally modified in response to the results from timing analysis. Modification of the system may include performing any one or more of the synthesis 710, placement 720, routing 730, and timing analysis 740 again or in an iterative manner.

At 760, an assembly procedure is performed. The assembly procedure involves creating a program file that includes information determined by the procedures described at 710, 720, 730, 740, and 750. The program file may be a bit stream that may be used to program a target device. According to an embodiment of the present disclosure, the procedures illustrated in FIG. 7 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

FIGS. 1-4, and 7 are flow charts that illustrate embodiments of the present disclosure. The procedures described in these figures may be performed by one or more EDA tools implemented by one or more computer systems. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 8:
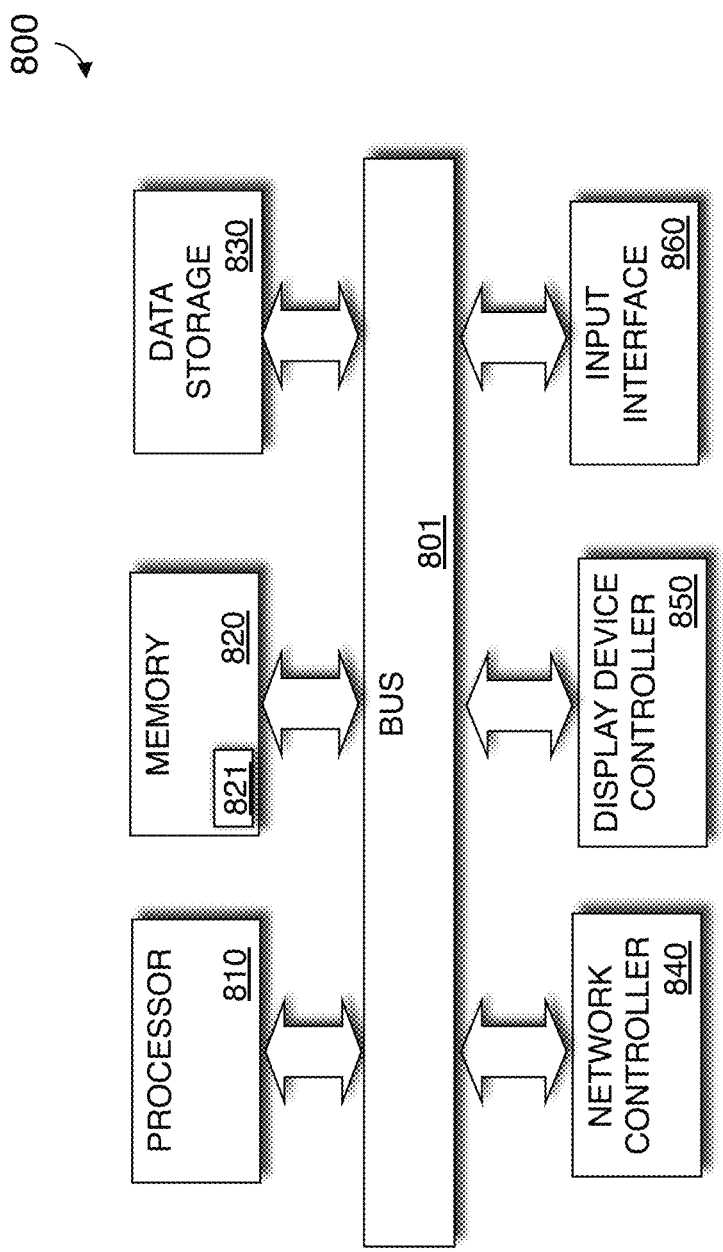
FIG. 8 is a block diagram of a computer system implementing a system designer according to an exemplary embodiment of the present disclosure.

FIG. 8 is a block diagram of an exemplary computer system 800 in which an example embodiment of the present disclosure resides. The computer system 800 includes a processor 810 that process data signals. The processor 810 is coupled to a bus 801 or other switch fabric that transmits data signals between processor 810 and other components in the computer system 800. The computer system 800 includes a memory 820. The memory 820 may store instructions and code represented by data signals that may be executed by the processor 810. A data storage device 830 is also coupled to the bus 801.

A network controller 840 is coupled to the bus 801. The network controller 840 may link the computer system 800 to a network of computers (not shown) and supports communication among the machines. A display device controller 850 is coupled to the bus 801. The display device controller 850 allows coupling of a display device (not shown) to the computer system 800 and acts as an interface between the display device and the computer system 800. An input interface 860 is coupled to the bus 801. The input interface 860 allows coupling of an input device (not shown) to the computer system 800 and transmits data signals from the input device to the computer system 800.

A system designer 821 may reside in the memory 820 and be executed by the processor 810. The system designer 821 may operate to perform high-level compilation, verification, HDL compilation, and/or program a target device. According to an embodiment of the present disclosure, the system designer 821 may implement the procedures described with reference to FIGS. 1-7.

Figure 9:
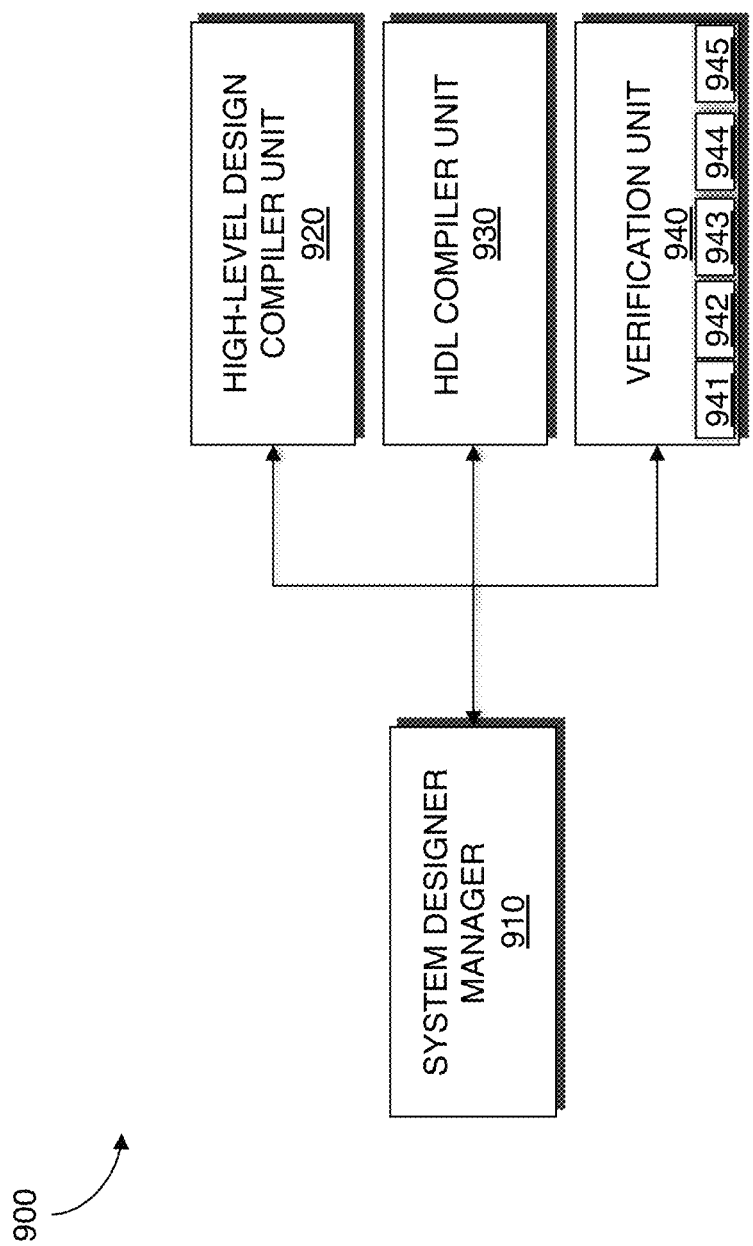
FIG. 9 is a block diagram of a system designer according to an exemplary embodiment of the present disclosure.

FIG. 9 illustrates a system designer 900 according to an embodiment of the present disclosure. The system designer 900 may be an EDA tool for designing a system on a target device such as an FPGA, structured application-specific integrated circuit (ASIC), ASIC, or other circuitry. FIG. 9 illustrates modules implementing an embodiment of the system designer 900. According to one embodiment, the modules represent software modules and system design may be performed by one or more computer systems such as the one illustrated in FIG. 9 executing sequences of instructions represented by the modules shown in FIG. 9. Execution of the sequences of instructions causes the computer system to support system design as will be described hereafter. In alternate embodiments, hard-wire circuitry may be used in place of or in combination with software instructions to implement embodiments of present disclosure. Thus, embodiments of present disclosure are not limited to any specific combination of hardware circuitry and software. The system designer 900 includes a designer manager 910. The designer manager 910 is connected to and transmits data between the components of the system designer 900.

The system designer 900 includes a high-level design compiler (HLC) unit 920. The high-level compiler unit 920 interprets a description of the system, which may be an algorithmic description of a desired behavior written in a computer language description, and generates a digital hardware description that implements the behavior. The computer language description may be a high-level description written in a serial computer language such as C, C++, or other serial computer language. The computer language description may be analyzed, architecturally constrained, and scheduled to create a register transfer level (RTL) HDL of the system. The HDL of the system may integrate information regarding other components or hosts that may be pre-designed. The HDL of the system may be referred to as a hardware version of the system. According to an embodiment of the present disclosure, in addition to creating a hardware version of the system, the high-level compiler unit 920 may create a software version of the system that is executable on a processor and may be used for the purpose of performing simulation. The software version may be independent of any specific resources of a target device and may be independent of the HDL of the system. According to an embodiment of the present disclosure, high-level compilation also creates a serial testbench executable from a description of the testbench provided by the user in the computer language description. The serial testbench may be used to debug and test the system during verification. According to an embodiment of the present disclosure, the high-level compiler unit 920 may perform procedures described with reference to FIGS. 1 and 2.

The system designer 900 includes a hardware description language (HDL) compilation unit 930. The hardware description language compilation unit 930 performs synthesis, placement, routing, and timing analysis on the HDL and generates a program file. According to an embodiment of the present disclosure, the hardware description language compilation unit 930 may perform procedures described with reference to FIGS. 1 and 7.

The system designer 900 includes a verification unit 940. The verification unit 940 tests the parallel nature of the system using a serial testbench. It should be appreciated that the verification unit 940 may perform the verification procedures described with reference to FIGS. 1, and 3-5. The verification unit 940 includes an instance generation unit 941. The instance generation unit 941 generates a first instance of a system and second instance of a system. It should be appreciated that the first instance and the second instance of the system may be implemented by different components and executed in parallel or by the same component and executed serially.

The verification unit 940 includes an input vector management unit 942. The input vector management unit 942 generates input vectors for testing the system. According to an embodiment of the present disclosure, the input vector management unit 942 generates input vectors by executing the serial testbench.

The verification unit 940 includes an instance management unit 943. The instance management unit 943 passes the input vectors to the first and second instances of the system. The instance management unit 943 manages the first instance of the system such that it processes the input vectors in a serial manner. For example, a subsequent call to a function is made only after results from a previous call to the function is returned. The results generated by the first instance of the system are stored and are returned to process subsequent input vectors from the serial testbench. The instance management unit 943 manages the second instance of the system such that it processes the input vectors in a parallel manner. According to an embodiment of the present disclosure, the second instance runs in a separate thread and is invoked with maximum parallelism. For example, a subsequent call to a function may be made before results from a previous call to the function is returned.

According to an embodiment of the present disclosure, where the first instance and the second instance of the system are implemented by different components and are executed in parallel, the instance management unit 943 manages the first instance of the system such that it processes the input vectors at a faster rate than the second instance of the system processes the input vectors. This allows the first instance of the system to generate results from processing the input vectors in time if the second instance requires the results. As such, data dependency issues resulting by having the second instance issue a plurality of calls to a function to be made in parallel may be resolved by using results generated ahead of time by the first instance of the system.

According to an alternative embodiment of the present disclosure, where the first instance and the second instance of the system are implemented by the same component and are executed serially, the instance management unit 943 manages the first instance of the system such that it processes the input vectors a first time during a first period of time. After completion of the first period of time, the instance management unit 943 manages the second instance of the system such that it processes the same input vectors during a second period of time.

The verification unit 940 includes a results processing unit 944. The results processing unit 944 compares the results from the serial testbench execution. According to an embodiment of the present disclosure, results generated by the first instance of the system that executes the serial testbench in a serial manner are compared with results generated by the second instance of the system that executes the serial testbench in a parallel manner. If the results generated from the first instance of the system and the results generated from the second instance of the system are equivalent, there is confirmation that there is serially equivalence for a fully parallel execution of the system. It should be appreciated that the definition of equivalency may be defined and adjusted by a user.

The verification unit 940 includes a report generation unit 945. The report generation unit 945 generates a report that may provide performance data from execution of the serial testbench as well as an as to indication whether there is serial equivalency.

It should be appreciated that embodiments of the present disclosure may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 10:
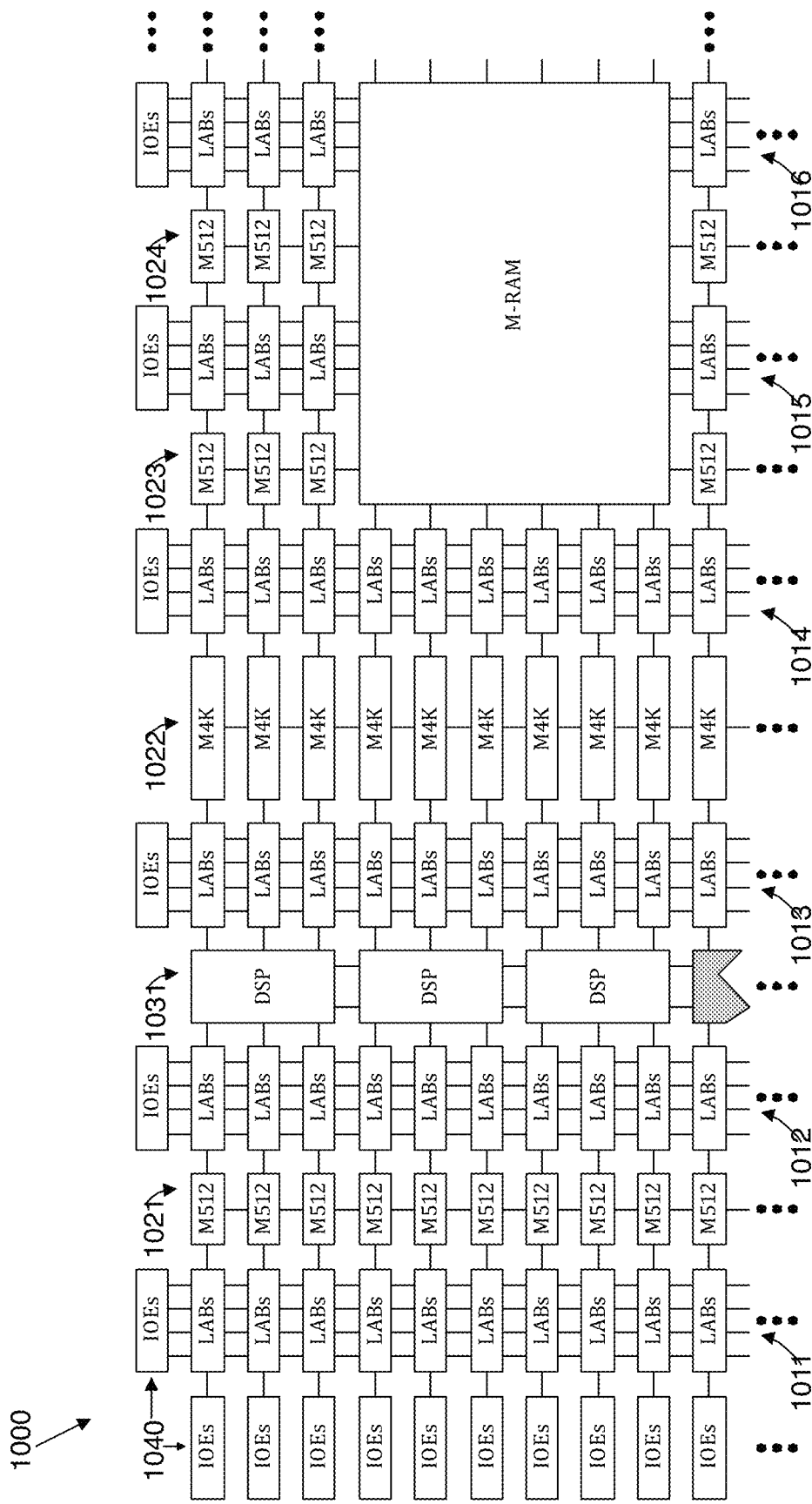
FIG. 10 illustrates an exemplary target device according to an exemplary embodiment of the present disclosure.

FIG. 10 illustrates a device 1000 that may be used to implement a target device according to an embodiment of the present disclosure. The device 1000 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present disclosure, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present disclosure, the logic block may operate similarly to an adaptive logic module (ALM), such as those found in Stratix devices manufactured by Altera Corporation. LABs are grouped into rows and columns across the device 1000. Columns of LABs are shown as 1011-1016. It should be appreciated that the logic block may include additional or alternate components.

The device 1000 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1000. Columns of memory blocks are shown as 1021-1024.

The device 1000 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1000 and are shown as 1031.

The device 1000 includes a plurality of input/output elements (IOEs) 1040. Each IOE feeds an IO pin (not shown) on the device 1000. The IOEs 1040 are located at the end of LAB rows and columns around the periphery of the device 1000. Each IOE may include a bidirectional IO buffer and a plurality of registers for registering input, output, and output-enable signals.

The device 1000 may include routing resources such as LAB local interconnect lines, row interconnect lines ("H-type wires"), and column interconnect lines ("V-type wires") (not shown) to route signals between components on the target device.

The components and routing resources on the target device 1000 may be programmed to implement custom memory interfaces that access different memory systems on and off the target device 1000. The custom memory interfaces may be designed to work together with the unique properties of the memory systems in order to efficiently utilize area, power, and resources on the target device, and to increase performance.

The following examples pertain to further embodiments. In one embodiment, a method for designing a system on a target device includes performing high-level compilation on a high-level language source file to generate a hardware description language (HDL) of the system and a serial testbench for the system. Verification is performed on the system that examines a parallel nature of the system by using the serial testbench.

In a further embodiment, the parallel nature of the system allows a plurality of calls to a function to be made in parallel to process a plurality of input vectors.

In a further embodiment, the serial testbench tests the system serially by issuing a subsequent call to a function after a previous call to the function has been completed.

In a further embodiment, using the serial testbench comprises testing the system by issuing a function call before a previous call to the function has been completed.

In a further embodiment performing verification on the system comprises generating a first instance and a second instance of the system, executing the serial testbench to generate input vectors, passing the input vectors to the first instance of the system to test the system, and passing the input vectors to the second instance to test the system, wherein the first instance of the system processes the input vectors at a rate faster than which the second instance of the system processes the input vectors, and wherein one or more results generated by the first instance of the system can be used to resolve data dependencies from passing the input vectors to the second instance of the system.

In a further embodiment, passing the input vectors to the second instance of the system comprises issuing a subsequent call to a function before a previous call to the function has been completed.

In a further embodiment, the method further comprises comparing results generated from passing the input vectors to the first instance of the system with results generated from passing the test vectors to the second instance of the system, and generating a notification in response to whether the results are equivalent.

In a further embodiment, equivalency is based on user definition.

In a further embodiment performing verification on the system comprises executing the testbench to generate input vectors, passing the input vectors to an instance of the system a first time, and passing the input vectors to the instance of the system a second time, wherein one or more results generated from passing the input vectors on the instance of the system the first time can be used to resolve data dependencies from passing the input vectors to the instance of the system the second time.

In a further embodiment, the first instance of the system is a software version of the system that does not originate from the HDL of the system, and the second instance of the system is a hardware version of the system that originates from the HDL of the system.

In a further embodiment, the first instance of the system is executed on a computer system executing the testbench, and wherein the second instance of the system is executed on one of a simulator system and the target device.

In a further embodiment, the first instance of the system and the second instance of the system are hardware versions of the system that originate from the HDL of the system.

In a further embodiment, the first instance of the system and the second instance of the system are executed on one of a simulator system and the target device.

In a further embodiment, verification is performed after HDL compilation of the system where synthesis, placement, and routing is performed on the system.

In a further embodiment, verification is performed after the system is programmed on the target device.

In a further embodiment, the high level language is a serial language.

In a further embodiment, a non-transitory computer-readable medium having sequences of instructions, the sequences of instructions including instructions which, when executed, causes a processor to perform the method of any one of the previously described embodiments.

In a further embodiment, an apparatus comprising means to perform a method as claimed in any one of the previously described embodiments.

In another embodiment a method for performing verification on a system, comprises executing a serial testbench, that tests the system serially by issuing a subsequent call to a function after a previous call to the function has been completed, to generate input vectors, passing the input vectors to a first instance of the system, and passing the input vectors to a second instance of the system, wherein one or more results generated by the first instance of the system can be used to resolve data dependencies from passing the input vectors the second instance of the system.

In a further embodiment, passing the input vectors to the first instance of the system is performed concurrently with passing the input vectors to the second instance of the system.

In a further embodiment, passing the input vectors to the second instance of the system is performed after the first instance of the system has completed processing the input vectors.

In a further embodiment, passing the input vectors to the first instance of the system is performed after high level language compilation, and passing the input vectors on the second instance of the system is performed after hardware description language compilation.

In a further embodiment, the first instance of the system and the second instance of the system is implemented by a same component.

In a further embodiment, a non-transitory computer-readable medium having sequences of instructions, the sequences of instructions including instructions which, when executed, causes a processor to perform the method of any one of the previously described embodiments.

In a further embodiment, an apparatus comprising means to perform a method as claimed in any one of the previously described embodiments.

In another embodiment a system designer, comprise a high-level compilation unit that generates a hardware description language (HDL) of a system and a serial testbench for the system from a high-level language source file. The system designer also includes a verification unit that examines a parallel nature of the system by using the serial testbench.

In a further embodiment, the parallel nature of the system allows a plurality of calls to a function to be made in parallel to process a plurality of input vectors.

In a further embodiment, the serial testbench tests the system serially by issuing a subsequent call to a function after a previous call to the function has been completed.

In a further embodiment, the system designer comprises an instance generation unit that generates a first instance and a second instance of the system. The system designer also includes an input vector management unit that executes the serial testbench to generate input vectors. The system designer also includes an instance management unit that passes the input vectors to the first and second instances of the system to test the system, and that regulates the first instance of the system such that it processes the input vectors at a rate faster than which the second instance of the system processes the input vectors, and wherein one or more results generated by the first instance of the system can be used to resolve data dependencies from passing the input vectors to the second instance of the system.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. A method for designing a system on a target device, comprising:
   performing high-level compilation on a high-level language source file to generate a hardware description language (HDL) of the system and a serial testbench for the system, wherein the serial testbench comprises a function; and
   performing verification on the system that examines a parallel nature of the system by using the serial testbench to test the system by issuing a subsequent call to the function before a previous call to the function has been completed.

2. The method of claim 1, wherein the parallel nature of the system allows a plurality of calls to the function to be made in parallel to process a plurality of input vectors.

3. The method of claim 1, wherein the serial testbench tests the system serially by issuing a subsequent call to the function after a previous call to the function has been completed.

4. The method of claim 1, wherein the target device is a field programmable gate array.

5. The method of claim 1, wherein performing verification on the system comprises:
   generating a first instance and a second instance of the system;
   executing the serial testbench to generate input vectors;
   passing the input vectors to the first instance of the system to test the system; and
   passing the input vectors to the second instance to test the system, wherein the first instance of the system processes the input vectors at a rate faster than which the second instance of the system processes the input vectors, and wherein one or more results generated by the first instance of the system can be used to resolve data dependencies from passing the input vectors to the second instance of the system.

6. The method of claim 5, wherein passing the input vectors to the second instance of the system comprises issuing a subsequent call to the function before a previous call to the function has been completed.

7. The method of claim 5 further comprising:
comparing results generated from passing the input vectors to the first instance of the system with results generated from passing the input vectors to the second instance of the system; and
generating a notification in response to whether the results are equivalent.

8. The method of claim 7, wherein equivalency is based on user definition.

9. The method of claim 5, wherein the first instance of the system is a software version of the system that does not originate from the HDL of the system, and the second instance of the system is a hardware version of the system that originates from the HDL of the system.

10. The method of claim 9, wherein the first instance of the system is executed on a computer system executing the serial testbench, and wherein the second instance of the system is executed on one of a simulator system and the target device.

11. The method of claim 5, wherein the first instance of the system and the second instance of the system are hardware versions of the system that originate from the HDL of the system.

12. The method of claim 11, wherein the first instance of the system and the second instance of the system are executed on one of a simulator system and the target device.

13. The method of claim 1, wherein verification is performed after HDL compilation of the system where synthesis, placement, and routing is performed on the system.

14. The method of claim 1, wherein verification is performed after the system is programmed on the target device.

15. The method of claim 1, wherein the high level language is a serial language.

16. A method for designing a system on a target device, comprising:
performing high-level compilation on a high-level language source file to generate a hardware description language (HDL) of the system and a serial testbench for the system; and
performing verification on the system that examines a parallel nature of the system by using the serial testbench, wherein performing verification on the system comprises:
executing the serial testbench to generate input vectors;
passing the input vectors to an instance of the system a first time; and
passing the input vectors to the instance of the system a second time, wherein one or more results generated from passing the input vectors to the instance of the system the first time can be used to resolve data dependencies from passing the input vectors to the instance of the system the second time.

17. A non-transitory computer readable medium including a sequence of instructions stored thereon for causing a computer to execute a method for performing verification on a system, comprising:
executing a serial testbench, that tests the system serially by issuing a subsequent call to a function after a previous call to the function has been completed, to generate input vectors;
passing the input vectors to a first instance of the system; and
passing the input vectors to a second instance of the system, wherein one or more results generated by the first instance of the system can be used to resolve data dependencies from passing the input vectors to the second instance of the system.

18. The non-transitory computer readable medium of claim 17, wherein passing the input vectors to the first instance of the system is performed concurrently with passing the input vectors to the second instance of the system.

19. The non-transitory computer readable medium of claim 17, wherein passing the input vectors to the second instance of the system is performed after the first instance of the system has completed processing the input vectors.

20. The non-transitory computer readable medium of claim 19, wherein passing the input vectors to the first instance of the system is performed after high level language compilation, and passing the input vectors to the second instance of the system is performed after hardware description language compilation.

21. The non-transitory computer readable medium of claim 19, wherein the first instance of the system and the second instance of the system are implemented by a same component.

22. A system designer, comprising:
a high-level compilation unit that generates a hardware description language (HDL) of a system and a serial testbench for the system from a high-level language source file, wherein the serial testbench comprises a function; and
a verification unit that examines a parallel nature of the system by using the serial testbench to test the system by issuing a subsequent call to the function before a previous call to the function has been completed.

23. The system designer of claim 22, wherein the parallel nature of the system allows a plurality of calls to the function to be made in parallel to process a plurality of input vectors.

24. The system designer of claim 22, wherein the serial testbench tests the system serially by issuing a subsequent call to the function after a previous call to the function has been completed.

25. The system designer of claim 22, wherein the system designer comprises:
an instance generation unit that generates a first instance and a second instance of the system;
an input vector management unit that executes the serial testbench to generate input vectors; and
an instance management unit that passes the input vectors to the first and second instances of the system to test the system, and that regulates the first instance of the system such that the first instance of the system processes the input vectors at a rate faster than which the second instance of the system processes the input vectors, and wherein one or more results generated by the first instance of the system can be used to resolve data dependencies from passing the input vectors to the second instance of the system.

* * * * *